United States Patent [19]
Yen

[11] Patent Number: 5,314,728
[45] Date of Patent: May 24, 1994

[54] CAPTURE LAYER AND METHOD FOR DELAYED ENTRAPMENT OF CONTAMINANT PARTICLES

[76] Inventor: Yung-Tsai Yen, 196 Tuscaloosa Ave., Atherton, Calif. 94025

[21] Appl. No.: 41,831

[22] Filed: Apr. 1, 1993

[51] Int. Cl.⁵ ............................................. A47G 1/12
[52] U.S. Cl. ..................................... 428/14; 428/913; 427/164; 427/331
[58] Field of Search .................. 428/14, 913; 427/164, 427/331

[56] References Cited

U.S. PATENT DOCUMENTS

| | | | |
|---|---|---|---|
| 3,500,129 | 3/1970 | Jowitt | 428/14 |
| 3,765,941 | 10/1973 | Gordon | 428/14 |
| 4,470,508 | 9/1984 | Yen | 428/14 |
| 4,697,701 | 10/1987 | Ying | 428/14 |

OTHER PUBLICATIONS

Japanese Pat. Appl. Pub. No. (A) Feb. 1989–48062.

*Primary Examiner*—Alexander S. Thomas
*Attorney, Agent, or Firm*—Kolisch, Hartwell, Dickinson, McCormack & Heuser

[57] ABSTRACT

A capture layer is disclosed for delayed entrapment of contaminant particles that may accumulate on the inner surface of a pellicle during or after pellicle fabrication. The capture layer is formed of a delayed curable material that resides on the inner surface of the pellicle, which pellicle includes a pellicle membrane and a peripheral pellicle frame. The material may reside on the underside of the membrane and the inside surface of the frame. In one embodiment the material is a gel and is formed from an epoxy-based mixture. A pellicle system is also disclosed which includes the capture layer. A method for delayed entrapment of such contaminant particles is also disclosed which involves the forming of a time-delay-curable capture layer on the inner side of a pellicle.

20 Claims, 1 Drawing Sheet

CAPTURE LAYER AND METHOD FOR DELAYED ENTRAPMENT OF CONTAMINANT PARTICLES

BACKGROUND OF THE INVENTION

The present invention relates to pellicles that are use in the semi-conductor chip industry, and more particularly to a capture layer for delayed entrapment of contaminant Particles that may accumulate on pellicles during fabrication, packaging, handling, and mounting on photomasks.

In the semi-conductor chip industry it is well known that pattern transfer from the photomask to substrate is accomplished by exposing a mask to a light source. During the pattern transfer process, also called the photolithographic process, patterns on the photomask are projected onto the substrate which has been treated with a photo-sensitive substance. This results in the mask etchings being reproduced onto the substrate. Unfortunately, any foreign substance on the surface of the mask will also be reproduced on the substrate and therefore Will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination which would ordinarily land on the mask surface instead falls onto the pellicle membrane.

Pellicles substantially eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography even though they are out of focus. Equally unacceptable are particles (whether large or small) that are deposited on the underside of the pellicle membrane or the pellicle frame. Such particles may drop onto the mask surface during photolithography, which is precisely what is to be avoided by using pellicles.

It is also critical that the pellicle membrane be extremely uniform across its surface. This is so that the light passing through the membrane during lithography is unobstructed and is not in any way refracted. Thus, the composition of the membrane must be highly uniform, and the membrane must be evenly tensioned across the pellicle frame. Also, it is important to ensure that a continuous seal exists between the thin film and the frame.

To further understand these important requirements, it is necessary to provide an explanation as to how pellicles are formed.

As is known in the art, forming an optical membrane is the first step in pellicle manufacture. Commonly, the membrane is prepared by spinning a suitable polymer, such as nitrocellulose or a nitrocellulose-containing polymer, on a substrate. The newly formed membrane is then removed from the substrate and held under tension, adjacent its periphery, to prepare it for subsequent manufacturing steps.

Next, a frame is fastened, or bonded, to a working area of the membrane, framing the working area. After fastening, the frame and the working area of the membrane attached to it are ready to be separated from the remaining area of the membrane.

During pellicle fabrication, as well as pellicle packaging and eventual use of the device, it is necessary to maintain a clean environment around the pellicle. When "clean environment" or "clean" is mentioned in this application, it should be understood that applicant is referring to "clean" at the microscopic level known to those skilled in the art.

One problem that results from a contaminated environment around the pellicle is that contaminants may accumulate on the inner surface of the pellicle frame and the underside of the pellicle membrane. Such accumulation is a serious problem because the position of contaminants on the inner surface of the pellicle makes it likely that they will fall from the pellicle, due to gravity or otherwise, onto the photomask resulting in improper projection printing and thus an unacceptable semiconductor chip product. Normal handling of the pellicle during mounting onto the photomask will cause some jarring of the pellicle which makes it likely that such accumulated contaminants will fall onto the photomask.

To deal with this contaminant-accumulation problem, there have been prior proposals involving the application of a protective membrane over the bottom of the frame after fabrication. Such protective membrane prevents further contaminants from accumulating on the inner side of the pellicle but does not deal with contaminants that may accumulate on such inner side during fabrication of the pellicle but prior to application of the protective membrane.

Other conventional proposals involve applying an adhesive to the underside of the pellicle membrane and the inner surface of the frame. Such proposals are found in Japanese Patent Application Publication (A) 1989-48062 to Nakagawa et al. and Japanese Patent Application Publication (B2) 1988-777 to Nakata et al. Other prior proposals, such as that disclosed in U.S. Pat. No. 4,470,508 to Yen, involve placing a contact adhesive on the inner surfaces of pellicle packaging to hold contaminant particles and prevent them from presenting such a contaminant-accumulation problem.

A problem associated with the proposals involving the use of adhesive on the inner side of the pellicle is that they propose tack-type adhesives that remain tacky and do not cure during the working life of the pellicle. The tacky adhesive helps to keep contaminants from falling onto the photomask, but there remains a possibility that they may fall during normal handling of the pellicle during the mounting step.

Accordingly, it is a general object of the present invention to provide an improved mechanism and method for entrapment of contaminant particles that may accumulate on pellicles during their fabrication, packaging, handling, and mounting on photomasks. More specific objects are to provide a mechanism and method which is relatively simple to fabricate, and which will not detract from the performance of the pellicle in terms of uniformity, transmissivity and other performance parameters.

SUMMARY OF THE INVENTION

One aspect of the invention comprises a capture layer that resides on an inner surface of a pellicle which includes a pellicle membrane fixedly positioned over a peripheral pellicle frame. The capture layer is formed from a delay curable material that is selectively curable during or after pellicle fabrication to entrap contaminants to the inner surface of the same. The material may reside on the underside of the membrane and the inside surfaces of the frame.

Another aspect of the invention comprises a method including the steps of: (1) forming a delay-curable capture layer on the inner surface of the pellicle during fabrication of the same, and (2) using the resulting inner-layered pellicle to protect a photomask from being contaminated during photolithography.

By using the capture layer of the present invention, and by practicing the method of the present invention, the drawbacks encountered with the prior art adhesives and methods are not experienced. Specifically, the capture layer of the present invention is delay-curable to allow for selective curing prior to actual use of the pellicle on a photomask. With such a selective-curing option, the user can choose when to entrap contaminants that have accumulated on the underside of the pellicle membrane and inside surfaces of the pellicle frame. For example, the user may want to entrap such contaminants after pellicle fabrication, during or after pellicle packaging, or even upon mounting the pellicle to the photomask.

The various objects and advantages which are attained by the invention will become more fully apparent as the description which now follows is read in conjunction with the drawings.

DETAILED DESCRIPTION OF THE INVENTION

Figure 1:
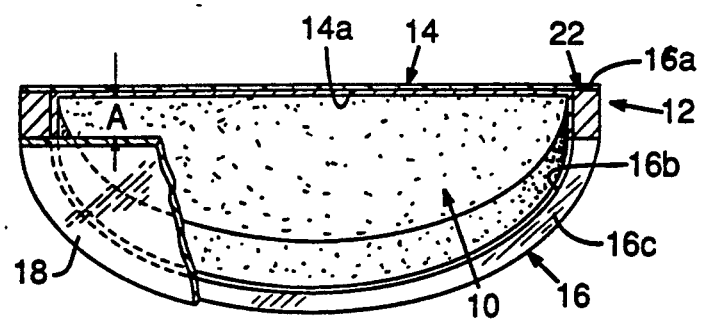
FIG. 1 is a fragmentary sectional isometric view of the underside of a first embodiment of the present invention with a protective membrane broken away to show the capture layer of the present invention after application to the underside of the pellicle membrane and the inside surface of the peripheral pellicle frame. The thickness of the membranes and the capture layer has been exaggerated for purposes of illustration.

Referring to the drawings, FIG. 1 shows the capture layer of the present invention at 10 residing on an inner surface of pellicle 12. Pellicle 12 includes a pellicle membrane 14 with an underside 14a that is tensed and bonded over a peripheral pellicle frame 16. Pellicle 12 is fabricated using known manufacturing processes such as those described above. For example, pellicle membrane 14 may be formed by spinning a suitable polymer on a substrate. Conventional formation of so-called anti-reflection (AR) coatings on membrane 14 may also be followed.

Capture layer 10 may be applied to pellicle membrane 14 when the latter is being formed and prior to bonding with frame 16. Alternatively, capture layer 10 may be applied to the underside of pellicle membrane 14 after bonding with frame 16. If the former application method is chosen, then, prior to mounting the pellicle membrane with capture layer 10 to frame 16, a portion of layer 10 that would otherwise come into contact with upper surface 16a would normally be removed using a suitable solvent or other conventional removal material.

With respect to applying capture layer 10 to inside surface 16b of frame 16, any suitable application technique may be used such as application by hand using a sponge-tipped applicator. Also, it is presently proposed to apply layer 10 to inside surfaces 16b prior to bonding pellicle membrane 14 to frame 16.

Still referring to FIG. 1, conventional protective membrane 18 may be applied to bottom surface 16c of frame 16 after bonding pellicle membrane 14 to it and after applying layer 10 to the inner surfaces of the pellicle.

With respect to the composition of capture layer 10, it should be formed of a delayed curing material. The material may be in the form of a slow cure epoxy, a gel, or slow cure silicone, but preferably a slow cure UV sensitive adhesive such as Norland Optical Adhesive No. 61 marketed by Norland Products Inc., is used. This adhesive may be applied to either the underside of pellicle membrane 14a or to the inside surface 16b of pellicle frame 16, or to both of those surfaces. The following description and the accompanying drawings depict the adhesive being applied to both surfaces (FIGS. 1–3) or to the inside surface 16b of the pellicle frame 16 only (FIGS. 4–5), but it is expected that in some applications the adhesive may only be applied to the underside 14a of pellicle membrane 14.

Figure 2:
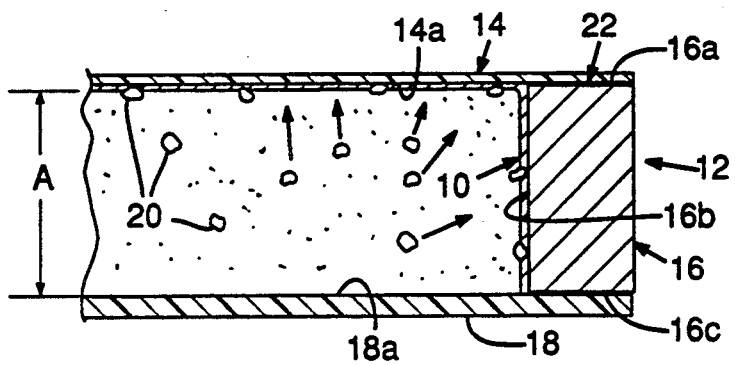
FIG. 2 is an enlarged, exaggerated, side elevation sectional view of a pellicle like that shown in FIG. 1 except that the underside of the pellicle membrane and the inside surface of the peripheral pellicle frame are shown with exaggerated contaminants having been captured by the capture layer of the invention.
Figure 3:
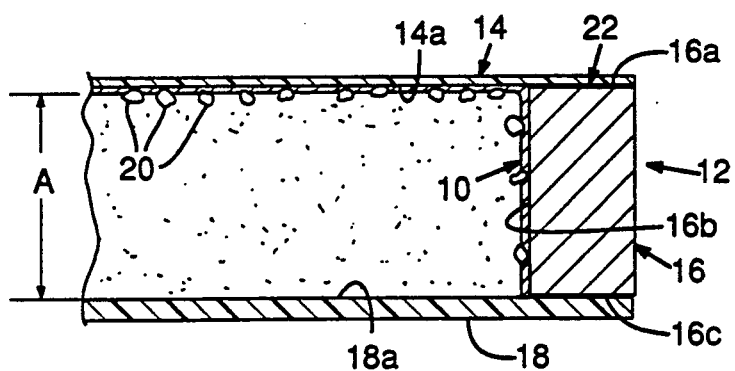
FIG. 3 corresponds to FIG. 2 except that time has transpired and the capture layer has been cured to entrap the contaminants.

Referring to FIGS. 2–3, fragmentary and enlarged views of pellicle 12 with capture layer 10 show schematically enlarged micro-sized contaminant particles 20 being captured (and ultimately entrapped) by capture layer 10. Particles 20 are located in a void space which is defined by underside 14a of pellicle membrane 14, inside surface 16b of pellicle frame 16 and inside surface 18a of protective membrane 18. Referring to pellicle membrane 14 and pellicle frame 16 for a moment, a suitable adhesive is used to bond membrane 14 to frame 16, and the resulting adhesive layer is depicted at 22. Suitable adhesive 22 might be in the form of a five-minute epoxy, a UV cured adhesive, but preferably is in the form of fast cured Norland No. 81 adhesive, marketed by Norland Products Inc. Thus, this adhesive would bond membrane 14 to frame 16 fairly quickly.

Still referring to FIG. 2, contaminant particles 20 depicted are representative of those that are trapped in void space A after protective membrane 18 is attached (again with a suitable adhesive) to underside 16c of frame 16. Such particles will move or float within void space A and will be captured by layer 10 instead of accumulating directly on underside 14a of pellicle membrane 14 and inside surface 16b of frame 16. As is shown in FIG. 2, certain contaminant particles have been captured by layer 10 but, because layer 10 has not yet cured, it is possible that such particles may become dislodged or escape from the layer. This is exactly the situation that occurs with conventional adhesives proposed by the above-identified patent application publications.

Referring to FIG. 3, a certain preselected time has transpired and layer 10 has cured. Alternatively, the adhesive has been subjected to a predetermined amount of UV light, in the event UV cured adhesive is used. That time may be as the user desires, i.e. prior to pellicle packaging, after pellicle packaging, or even upon mounting the pellicle to a photomask.

With respect to the time-delayed curing of layer 10, it should be understood that layer 10 may be formulated with a suitable material that has a desired time-delay, e.g., it is known to formulate epoxy-based mixtures with cure times of anywhere from minutes to hours to days. A wide range of curing times is also available with UV cured adhesive.

In the event Norland 61 is used as an adhesive on the inner surface of the frame and/or on the underside of the pellicle membrane, after the pellicle membrane is mounted to the frame, it is typically exposed to 20 miniwatts per square centimeter of light at 365 nanometers for 30 seconds. This will only partially cure the adhesive. Only after the pellicle has been mounted in place over the photomask, and photolithography is begun, will the adhesive fully cure, thereby trapping or encapsulating any particulate adhering thereto.

It may also be possible that layer 10 would be formulated to only partially cure during the working life of the pellicle. In addition, if UV light-emitting equipment is used to cure layer 10, such device may be used to cure it only partially. The bottom line is that as long as partial curing takes place, there will be capture of contaminant particles 20 by capture layer 10 as shown in FIG. 3.

Referring back to FIG. 1, the assembly including pellicle membrane 14, pellicle frame 16 and capture layer 10 may be thought of as an improved pellicle system for promoting substantially contaminant-free photolithography for reasons discussed in connection with FIGS. 2 and 3.

Figure 4:
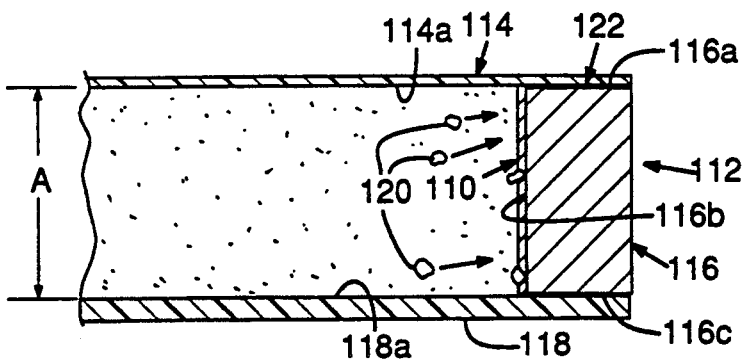
FIGS. 4 and 5 correspond to FIGS. 3 and 4 except that they depict a second embodiment of the present invention.
Figure 5:
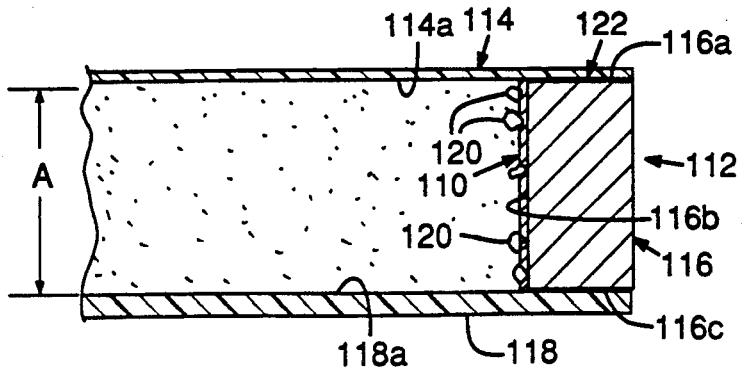

The embodiment of FIGS. 4-5 is very similar to that of FIGS. 1-3 except that the capture layer only extends over the inside surface of the frame, and not across the underside of the pellicle membrane. Because of the similarity of these embodiments, corresponding components of the embodiment of FIGS. 4-5 have been identified with the same numbers as FIGS. 1-3 except that they are in the 100 series.

It should also be understood that the present invention may take the form of a method for delayed entrapment of contaminant particles that may accumulate on inner surfaces of a pellicle during or after its fabrication. Such method includes the step of forming a delay-curable capture layer 10 on the inner surfaces of pellicle 12 or 112, i.e., underside 14a of pellicle 14 (or 114a and 114) and inside surface 16b of frame 16 (or 116b and 116). The method also includes the step of curing the capture layer after fabrication of the pellicle but prior to actual use of the resulting inner-layered pellicle. The curing step may be carried out according to any of the various options outlined above. It is even possible that curing would not be completed until after the pellicle is mounted to a photomask, but this is not the normal circumstance.

Accordingly, while the preferred method of practicing the present invention and a preferred embodiment of the apparatus of the present invention has been described, other variations and modifications are possible and may be made without departing from the spirit of the invention.

It is claimed and desired to secure by Letters Patent:

1. In a pellicle having an outer surface and an inner surface, and that includes a pellicle membrane with an underside that is tensed and bonded over a peripheral pellicle frame, a capture layer for delayed entrapment of contaminant particles that may accumulate on a pellicle during and after it is fabricated, comprising:
   delay curable material residing on the inner surface of the pellicle and being selectively curable to entrap such contaminant particles.

2. The capture layer of claim 1 wherein the material resides on the underside of the pellicle membrane.

3. The capture layer of claim 1 wherein the material resides on the inside of the peripheral pellicle frame.

4. The capture layer of claim 1 wherein the material resides on the inside of the pellicle frame and on the underside of the pellicle membrane.

5. The capture layer of claim 1 wherein the material is formed as a gel.

6. The Capture layer of claim 1 wherein the material is formed from an epoxy-based mixture.

7. The capture layer of claim 1 wherein the material is designed to be only partially curable.

8. The capture layer of claim 1 wherein the material is designed to be substantially cured upon application of UV light.

9. The capture layer of claim 1 wherein the material is formed from a silicone-based mixture.

10. A method for delayed entrapment of contaminant particles that may accumulate on an inner surface of a pellicle during or after it is fabricated, which pellicle includes a pellicle membrane and a peripheral pellicle frame, comprising:
    forming a delay-curable capture layer on the inner surface of the pellicle during fabrication of the same; and
    curing the capture layer after pellicle fabrication for protection of a photomask against contamination during photolithography.

11. The method of claim 10 wherein the step of curing the capture layer is performed prior to actual use of the pellicle in a photolithographic process.

12. The method of claim 10 wherein the forming step includes applying such a layer to the underside of the pellicle membrane and to the inside surface of the peripheral pellicle frame.

13. The method of claim 12 wherein the curing step involves partial curing of the capture layer.

14. The method of claim 12 wherein the curing step involves substantially curing the capture layer.

15. The method of claim 10 wherein the curing step involves partial curing of the capture layer.

16. The method of claim 10 wherein the curing step involves substantially curing the capture layer.

17. An improved pellicle system for promoting contaminant-free photolithography, including:
 a peripheral pellicle frame;
 a pellicle membrane with an underside that is tensed and bonded over the peripheral pellicle frame; and
 a capture layer formed from a delay-curable material and residing on the underside of the pellicle membrane and the inside surface of the pellicle frame, the capture layer providing for delayed entrapment of contaminant particles that may accumulate on the pellicle system during and after it is fabricated.

18. The pellicle system of claim 17 wherein the capture layer is formed as a gel.

19. The pellicle system of claim 18 wherein the capture layer is formed from an epoxy-based mixture.

20. The pellicle system of claim 17 wherein the capture layer is formed from a silicon-based mixture.

* * * * *